United States Patent
Borzi et al.

(10) Patent No.: US 8,476,136 B2
(45) Date of Patent: Jul. 2, 2013

(54) METHOD AND A STRUCTURE FOR ENHANCING ELECTRICAL INSULATION AND DYNAMIC PERFORMANCE OF MIS STRUCTURES COMPRISING VERTICAL FIELD PLATES

(75) Inventors: Anna Borzi, Nicolosi (IT); Corrado Coccorese, Pedara (IT); Giuseppe Morale, Catania (IT); Domenico Repici, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 54 days.

(21) Appl. No.: 13/324,896

(22) Filed: Dec. 13, 2011

(65) Prior Publication Data
US 2012/0146135 A1 Jun. 14, 2012

(51) Int. Cl.
*H01L 21/28* (2006.01)
*H01L 29/78* (2006.01)

(52) U.S. Cl.
USPC ........... 438/270; 438/272; 438/585; 438/589; 257/296; 257/328; 257/330; 257/E21.19; 257/E29.262

(58) Field of Classification Search
USPC .................. 438/270, 589; 257/296, 328, 330, 257/E21.19, E29.262
See application file for complete search history.

(56) References Cited

U.S. PATENT DOCUMENTS

| | | |
|---|---|---|
| 2005/0167742 A1 | 8/2005 | Challa et al. |
| 2006/0261391 A1 | 11/2006 | Nakazawa et al. |
| 2007/0158721 A1* | 7/2007 | Akamatsu ..................... 257/296 |
| 2010/0078707 A1 | 4/2010 | Haeberlen et al. |
| 2012/0326229 A1* | 12/2012 | Poelzl et al. .................. 257/331 |

OTHER PUBLICATIONS

Barnes, J.J. et al., "Low Temperature Differential Oxidation for Double Polysilicon VLSI Devices," J. Electrochem. Soc. 126(10):1779-1785, Oct. 1979.
Hellberg, P.-E. et al., "Oxidation of silicon-germanium alloys. I. An experimental study," J. Appl. Phs. 82 (11):5773-5778, Dec. 1, 1997.

* cited by examiner

*Primary Examiner* — Angel Roman
(74) *Attorney, Agent, or Firm* — Seed IP Law Group PLLC

(57) ABSTRACT

In an MIS structure a field plate electrode is incorporated below a buried gate electrode by using an insulating oxide layer, which is formed concurrently with the gate dielectric layer. In order to obtain superior dynamic behavior and enhanced dielectric strength the oxidation behavior of the field plate electrode is modified, for instance by incorporating a desired high concentration of arsenic.

27 Claims, 8 Drawing Sheets

Figure 1A:
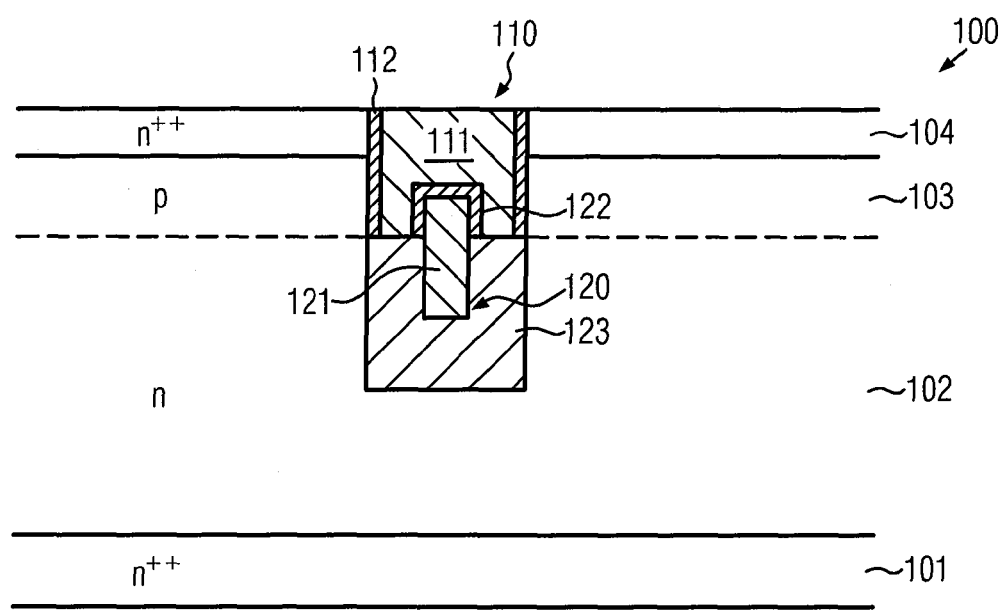

METHOD AND A STRUCTURE FOR ENHANCING ELECTRICAL INSULATION AND DYNAMIC PERFORMANCE OF MIS STRUCTURES COMPRISING VERTICAL FIELD PLATES

BACKGROUND

1. Technical Field

The present disclosure generally relates to semiconductor devices including MIS (metal-insulator-semiconductor) structures formed using a "vertical" device architecture in which a current flow may be controlled by electric field more efficiently on the basis a "buried" field plate.

2. Description of the Related Art

In the field of semiconductor devices immense progress has been achieved by reducing the dimensions of the circuit elements and improving associated process techniques and process tools. The continuous shrinkage of critical feature sizes has, at one cutting edge of the semiconductor technology, resulted in the fabrication of extremely complex integrated circuits which may comprise millions of transistor elements, which may be operated using extremely low supply voltages. On the other hand, the advances in materials, process techniques and process tools have also fuelled the development of complex integrated circuits, which comprise circuit elements such as transistors which are operated using moderately high voltages, i.e., from several volts to several hundred volts, possibly in combination with a more or less complex control circuitry including circuit elements that are to be operated on a very different potential. In the course of developing semiconductor devices including an increased number of individual circuit elements and/or circuit elements operated using high supply voltages, a wide variety of process technologies have been applied wherein field effect transistors have become a frequently used option in forming, for instance, very complex digital circuitry and high power circuitry due to certain advantages inherent to the field effect devices.

A field effect transistor comprises highly conductive semiconductor regions, typically referred to as drain and source regions, which are connected by a channel region in which a conductive channel may form upon applying an appropriate control voltage to a control electrode or gate electrode which is positioned close to the channel region and is separated therefrom by a thin insulating layer. The gate electrode structure, the insulation layer or gate dielectric layer and the adjacent semiconductor channel region thus define an MIS (metal-insulator-semiconductor) structure in order to establish a controlled current flow between the highly conductive drain and source regions through the controllable channel region. It should be appreciated that frequently the gate electrode structure may be provided in the form of a semiconductor material rather than using an actual "metal", as indicated by the abbreviation MIS structure. Using a highly conductive semiconductor material instead of a metal may offer a plurality of advantages, for instance with respect to superior alignment of the gate electrode structure with respect to the drain and source regions, a pronounced temperature stability during the further processing and the like. Consequently, in the context of this application, the generic term "MIS structure" is to be understood such that this term also includes any field effect structures comprising a control electrode formed using a semiconductor material, such as a silicon material and the like.

When forming field effect transistors which are to be operated using high voltages, possibly in combination with a high drive current capability, typically a plurality of design concepts are implemented in order to provide transistors having said high drive current in combination with a high electric breakdown voltage, while at the same time the switching speed of the transistor is to reduce as much as possible. Consequently, great efforts are being made in improving the overall transistor characteristics, wherein in recent developments vertical transistor structures have been proposed in order to obtain a high breakdown voltage while reducing the overall lateral size of the corresponding transistor element.

In a typical vertical transistor configuration the drain terminal is provided at one surface of the semiconductor substrate while the source terminal is provided at the opposite surface of the semiconductor material so that a desirable distance in terms of a high breakdown voltage between the drain and source regions may be obtained using the thickness of the substrate material, thereby reducing the lateral size compared to any planar transistor configurations in which the drain and source regions are provided at the same surface of the semiconductor material. In the vertical transistor architecture a corresponding drain area of reduced doping concentration, which is typically referred to as a drift region, connects to a channel region which may have the same or an inverse doping compared to the drain and source region, depending on the overall transistor configuration. For example, in an enrichment type transistor structure the conductivity type of the drain and source regions may be inverse with respect to the connectivity type of the channel region. Thus, the source region, the channel region and the drain region including the drift region form a stacked "vertical" configuration wherein the conductivity of the channel region is controlled using a control electrode or gate electrode that has to be positioned in close proximity to the channel region. To this end, in recent vertical transistor architectures, the gate electrode may be provided, at least partially, in the form of a "buried" electrode which is thus formed in a recess or cavity provided in the semiconductor material, wherein the cavity is electrically insulated from the semiconductor base material by the gate dielectric material formed therein.

Generally, the dynamic behavior of a transistor configuration depends on a plurality of transistor parameters, wherein in particular the generally parasitic capacitance between the gate electrode structure and the drain terminal of the transistor may have a significant influence on the resulting switching speed. On the other hand, a certain degree of capacitive coupling of the gate electrode to the channel region should be preserved in order to provide controllability of the conductive channel that forms in the channel region upon applying an appropriate control voltage. To this end, the gate dielectric layer has to be provided, based on a given material composition, for instance provided in the form of a silicon dioxide material, with a specified thickness, which is typically a compromise between the desired capacitive coupling to the channel region and a desired high dielectric strength since, for instance, extremely different voltages are applied to the drain and source regions compared to the gate electrode structure.

In order to improve the dynamic behavior of a vertical transistor comprising a buried gate electrode structure it has been suggested to reduce the drain-gate capacitance by implementing an additional electrode structure below the actual gate electrode structure, which may thus act as a field plate that appropriately influences the electric field conditions, for instance by shielding the gate electrode structure from a portion of the drain region or a drift region. For example, the additional electrode may be electrically connected to the source region and provided thus a well-defined potential in the vicinity of the actual buried gate electrode structure, thereby "transforming" a part of the drain-gate capacitance into an increased drain-source capacitance. Consequently, by providing an additional field plate in combination with a buried gate electrode structure in vertical transistors, superior transistor characteristics may be achieved however at the cost of additional process complexity. Therefore, in many strategies it is attempted to reduce the number of additional process steps wherein in some well-established process techniques the process of forming the gate dielectric material and forming a dielectric material layer for electrically insulating the field plate from the actual gate electrode structure are applied as a common oxidation process which, however, may result in reduced electric strength and a reduced gain in performance with respect to the dynamic behavior, as will be described in more detail with reference to FIGS. 1a-1g.

FIG. 1a schematically illustrates a cross-sectional view of a semiconductor device 100 which represents a basic configuration of an MIS structure in the form of a vertical transistor. The device 100 comprises a crystalline semiconductor material which is provided in the form of several stacked semiconductor regions, as discussed above. As shown, a first semiconductor region 101, which may also be considered as a portion of a basic semiconductor substrate, has a high doping concentration and acts as a drain of the device 100, which in the example shown is provided in the form of a highly n-doped silicon material when the device 100 is to represent an enrichment-type n-channel transistor. Furthermore, a semiconductor region 102, which is referred to as a drift region, has an n-type conductivity, however based on a significantly reduced doping concentration compared to the highly doped drain region 101. Furthermore, a channel region 103, which is illustrated as a lightly p-doped area, connects to the drift region 102 and also connects to a highly doped source region 104. It should be appreciated that for convenience any contact regime for connecting to the drain and source regions 101, 104 are not illustrated in FIG. 1a.

Moreover, a gate electrode structure 110 is provided in the form of a buried electrode structure and comprises a polysilicon electrode material 111, which is separated from the channel region 103 by a gate dielectric layer 112, which is typically provided in the form of a silicon dioxide material. Furthermore, the gate dielectric layer 112 also electrically insulates the electrode material 111 from the highly doped source region 104. Moreover, a further electrode structure 120, which may also be referred to as a field plate or field electrode, is provided below and partially adjacent to the gate electrode structure 110, wherein a moderately thick dielectric material 123, such as a silicon dioxide material, electrically isolates an electrode material 121, such as a polysilicon material, from the semiconductor region 102 and also partially from the electrode material 111. Moreover, a further dielectric layer 122, such as a silicon dioxide layer, electrically insulates a portion of the electrode material 121 that extends "into" the gate electrode structure 110 from the electrode material 111. Also in this case any additional interconnect regime for connecting the field plate 120 to any desired reference potential, such as the source potential that is connected to the source region 104 by any well-known contact regime, is not illustrated in FIG. 1a. Similarly, appropriate metallization regimes and interconnect structures are typically provided for connecting to the gate electrode structure 110, which are also not shown in FIG. 1a.

The basic configuration of the device 100 as shown in FIG. 1a may result in a superior dynamic behavior since, for instance, the electrode structure 120, i.e., the electrode material 121 thereof, may efficiently shield the electrode material 111 from the drain potential, thereby reducing the drain-gate capacitance while increasing the drain-source capacitance. Consequently, a superior dynamic behavior, such as reduced switching times may be accomplished using the vertical transistor configuration as shown in FIG. 1a. The provision of the field plate electrode structure 120, however, involves additional process steps for locally forming the electrode material 121 and also providing the dielectric material 122. In conventional approaches in particular, forming the dielectric material 122 is combined with the process of forming the gate dielectric material 112 which, however, may result in increased probability of creating device failures or a non-reliable dielectric breakdown voltage, since upon forming the dielectric materials 112, 122 during a common oxidation process, the resulting layer thickness for these materials may be of comparable magnitude which, however, may give rise to certain device failures, as will be explained later on in more detail.

Figure 1B:
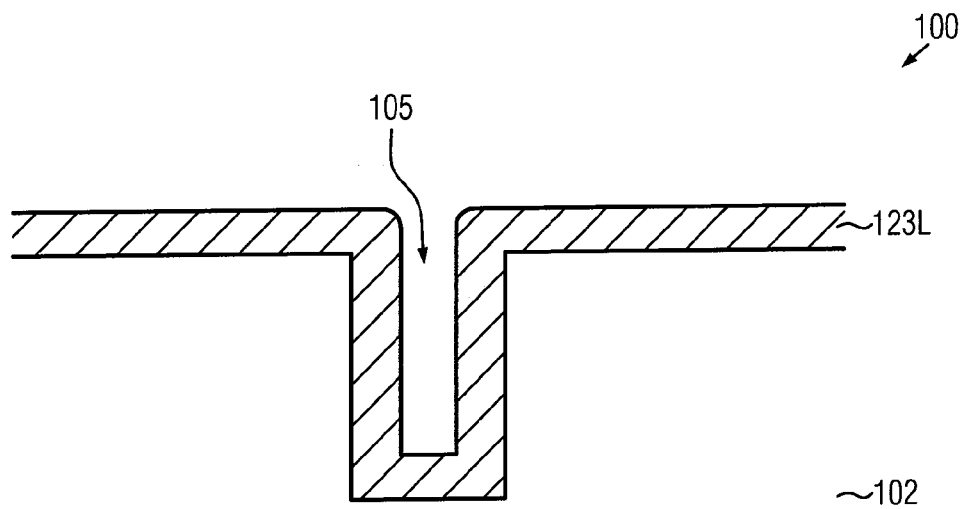

FIG. 1b schematically illustrates a portion of the structure 100 in an early manufacturing stage. As illustrated, a cavity 105, such as a trench or any other geometric element, is formed in the crystalline semiconductor material of the device 100 which, for convenience, is indicated as the semiconductor region 102 since, in some approaches, any other semiconductor regions, such as the channel region 103 and the highly doped source region 104, may not yet be provided. Furthermore, on any exposed surface areas of the crystalline semiconductor material 102 an insulating layer 123L is formed and comprises any appropriate dielectric material, such as silicon dioxide. The cavity 105 is formed using any well-established lithography techniques for providing an appropriate etch mask, which may then be used for etching into the crystalline semiconductor material 102 or which is used for patterning a hard mask material (not shown), which may then in turn be used for etching into the crystalline semiconductor material. Using a corresponding etch mask, the lateral position and size of the cavity 105 is defined, wherein the application of a substantially anisotropic etch recipe may thus result in a desired cross-sectional shape of the cavity 105. Appropriate etch recipes for etching a silicon material using plasma assisted etch techniques are well-established in the art. Next, the dielectric layer 123L is formed, for instance by deposition and/or oxidation, for instance using well-established process recipes such as CVD (chemical vapor deposition) using appropriate precursor materials, oxidation recipes and the like. The thickness of the layer 123L is selected such that it forms the dielectric material 123 of the field plate electrode structure 120 (cf. FIG. 1a) in order to appropriately isolate the electrode material 121 (cf. FIG. 1a) from the semiconductor material 102.

Figure 1C:
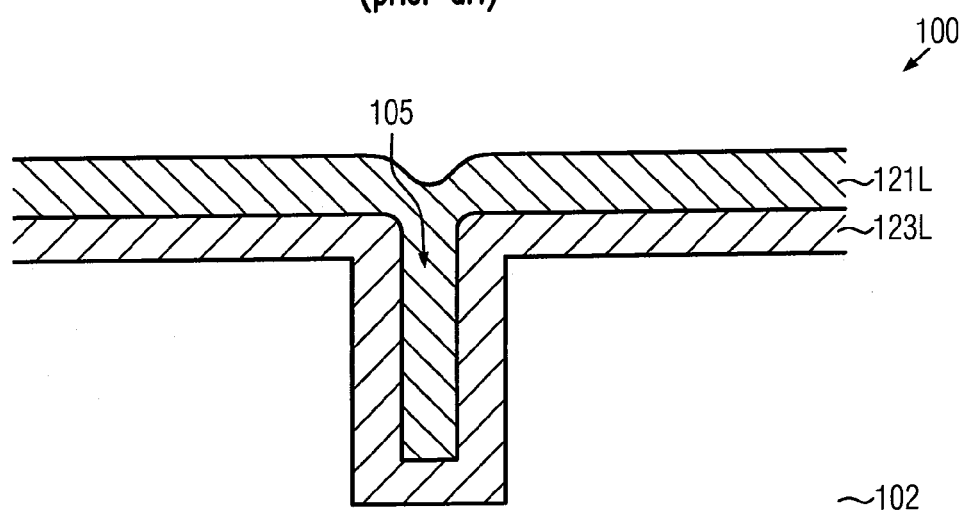

FIG. 1c schematically illustrates the device 100 in a further advanced stage in which a layer 121L of electrode material, for instance in the form of a polysilicon material, is deposited above the semiconductor material 102 and in the cavity 105. The layer 121L may be deposited using well-established low pressure CVD techniques and the like, possibly by incorporating a desired dopant species, such as phosphorous, during the deposition process in order to enhance the conductivity of the gate electrode to be formed from the layer 121L.

Figure 1D:
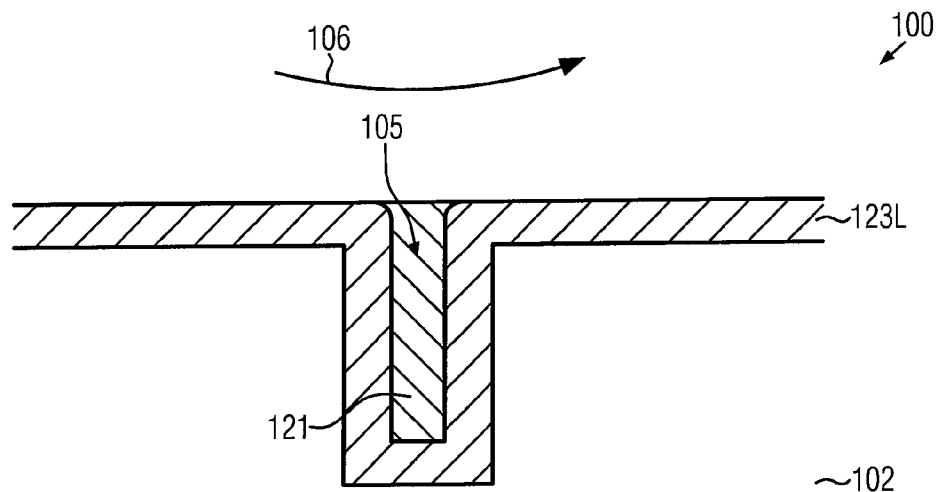

FIG. 1d schematically illustrates the device 100 when subjected to a material removal process 106, such as a CMP (chemical mechanical polishing) process, an etch process and the like, in order to remove material of the layer 121L (cf. FIG. 1c), thereby providing a substantially planar surface topography prior to the further processing. Planarizing the surface topography may provide for superior process conditions and thus process control and efficiency during the further processing, i.e., when removing a further portion of the electrode material 121 so as to define a desired height level for the gate electrode structure still to be formed.

Figure 1E:
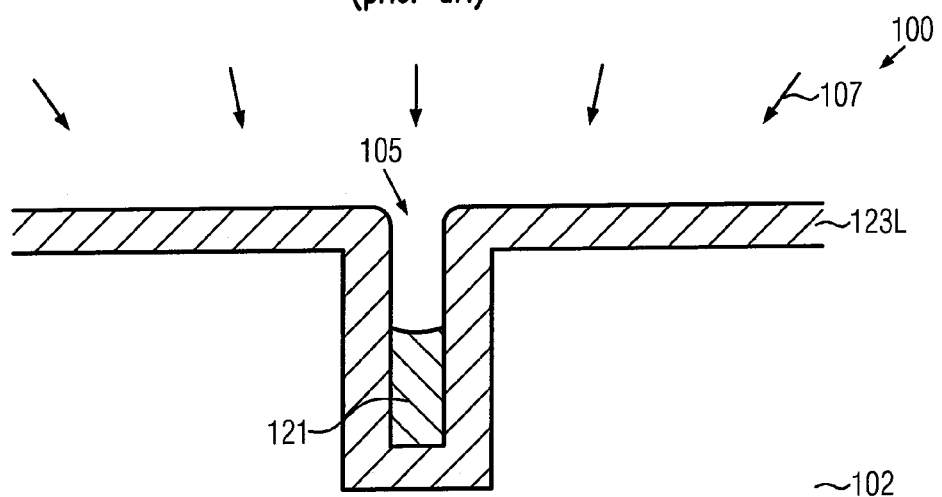

FIG. 1e schematically illustrates the device 100 when exposed to a reactive etch ambient 107, in which the electrode material 121 is recessed within the cavity 105 as required for forming a buried gate electrode structure in the cavity 105. To this end, any selective etch process may be applied for which a plurality of wet chemical or plasma assisted etch recipes are available. For example, silicon material may efficiently be removed selectively with respect to silicon dioxide using wet chemistries, such as potassium hydroxide, tetra methyl ammonium hydroxide (TMAH) and the like, while also very efficient plasma assisted etch recipes based on hydrogen bromide and the like are available.

Figure 1F:
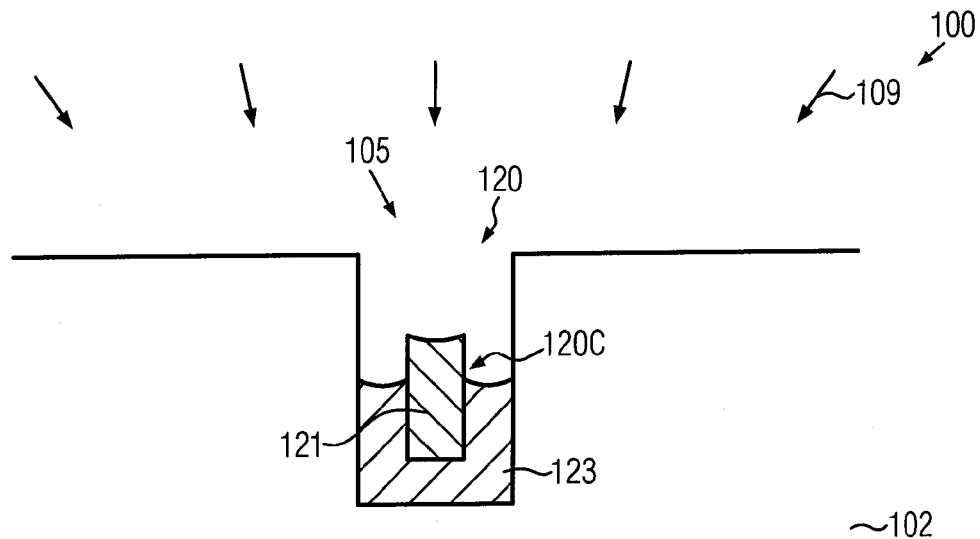

FIG. 1f schematically illustrates the device 100 in a further advanced stage in which a further material removal process 109, such as a wet chemical etch process, a plasma assisted etch process or a combination thereof is applied in order to remove an excess portion of the dielectric layer 123L (cf. FIG. 1e), thereby exposing a portion of the electrode material 121. As discussed above, the electrode material 121 is to be electrically insulated from a further electrode material that is still to be formed in the cavity 105. To this end, exposed surface areas of the material 121 have to be covered by a dielectric material, which is frequently formed in a process sequence in which also a gate dielectric material is formed on exposed sidewall surface areas of the cavity 105. In this case, in particular portions indicated as 120C of the field plate electrode 120 should be reliably covered by a dielectric material in order to provide for the desired dielectric strength of the electrode structure 120 with respect to the gate electrode structure still to be formed. To this end, a thickness of the dielectric material to be formed on exposed surface areas of the electrode material 121 should have a greater value compared to the gate dielectric material, which is to be provided with a specific thickness in order to comply with the overall transistor specifications, as also previously discussed. Although generally a polysilicon material may have a somewhat increased oxidation rate compared to the crystalline material of the semiconductor material 102, nevertheless a pronounced difference in the resulting layer thickness is difficult to achieve.

Figure 1G:
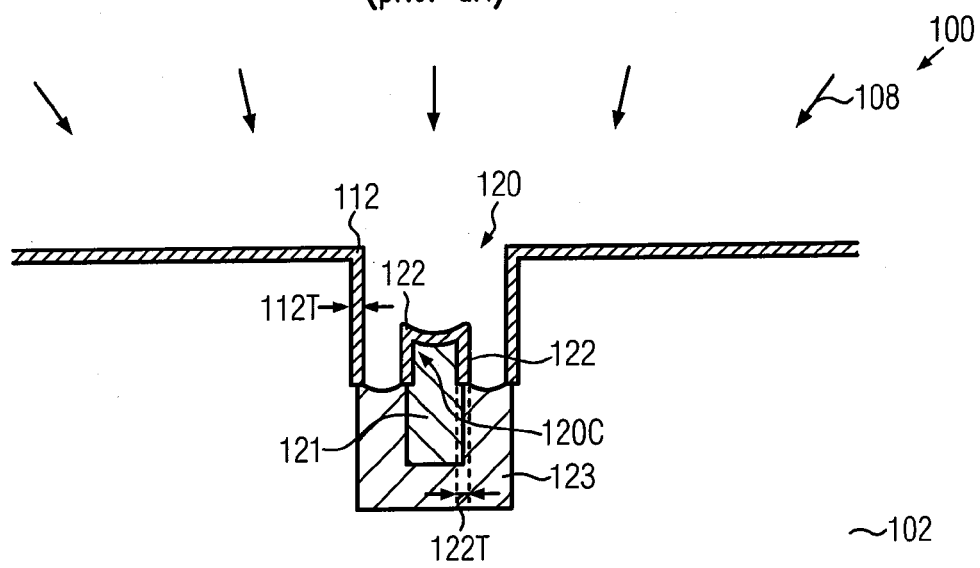

FIG. 1g schematically illustrates the semiconductor device 100 during an oxidation process 108 in which a gate dielectric material 112 is formed on exposed surface areas of the semiconductor region 102 while concurrently the dielectric material 122 is formed on exposed surface areas of the electrode material 121, wherein an average thickness 122T thereof may be somewhat greater, however, in the same order of magnitude as an average thickness 112T of the gate dielectric material 112. In particular, in the critical areas 120C, such as any corner areas, the local thickness may significantly deviate from the average thickness 122t, which may thus result in a reduced dielectric strength between the electrode material of the gate electrode structure 110 (cf. FIG. 1a) and the electrode material 121. Furthermore, the relatively low thickness 122t and in particular in combination with any local areas of further reduced thickness may contribute to an increased capacitive coupling, which may thus affect the dynamic behavior of the device 100.

Since basically an increased thickness of the layer 122 is desirable in order to ensure at least the same breakdown voltage between the gate electrode structure 110 and the filed plate electrode structure 120 as is obtained between the gate electrode structure 110 and the surrounding semiconductor areas, such as a source region still to be formed, additional process strategies have been proposed for increasing the average thickness 122T. For example, in some conventional approaches, the oxidation process 108 may be modified so as to result in an increased average thickness 122T, which may be accomplished by combining a dry oxidation ambient with a wet oxidation process which, however, may result in an overall reduced controllability of the entire oxidation process, thereby also resulting in less control of the finally obtained characteristics of the gate dielectric layer 112. Furthermore, generally the quality of the oxide material may be reduced compared to a dry oxidation process, thereby possibly also contributing to a degradation of transistor performance and/or uniformity of transistor characteristics. On the other hand, forming the layers 112 and 122 at least partially as separate dielectric materials may result in additional process complexity in terms of using one or more additional deposition steps in combination with further etch processes and the like, thereby contributing to significantly increased overall process complexity.

BRIEF SUMMARY

One embodiment of the present disclosure provides techniques and semiconductor devices in which a buried gate electrode structure in combination with a field plate electrode structure may be provided with a desired dielectric isolation from each other while avoiding, or at least reducing, the effects of one or more of the problems identified above.

Generally, the present disclosure provides semiconductor devices and manufacturing techniques in which a stacked configuration of electrode structures may be isolated from each other by means of a dielectric material that is concurrently formed with a dielectric material separating one of the electrode structures from a crystalline semiconductor material, such as a silicon material. To this end the oxidation rate, at least of an exposed surface portion of the lower-lying electrode material is actively increased so as to obtain an increased average thickness during an oxidation process, which is performed using given parameters that are selected so as to obtain a desired high quality dielectric material on the crystalline surface areas with a desired thickness.

BRIEF DESCRIPTION OF THE SEVERAL
VIEWS OF THE DRAWINGS

FIG. 1a schematically illustrates a cross-sectional view of a semiconductor device which represents a basic configuration of an MIS structure in the form of a vertical transistor.

FIG. 1b schematically illustrates a portion of the structure in an early manufacturing stage.

FIG. 1c schematically illustrates the device in a further advanced stage in which a layer of electrode material is deposited above the semiconductor material and in the cavity.

FIG. 1d schematically illustrates the device when subjected to a material removal process.

FIG. 1e schematically illustrates the device when exposed to a reactive etch ambient.

FIG. 1f schematically illustrates the device in a further advanced stage in which a further material removal process is applied in order to remove an excess portion of the dielectric layer.

FIG. 1g schematically illustrates the semiconductor device during an oxidation process.

Figure 2A:
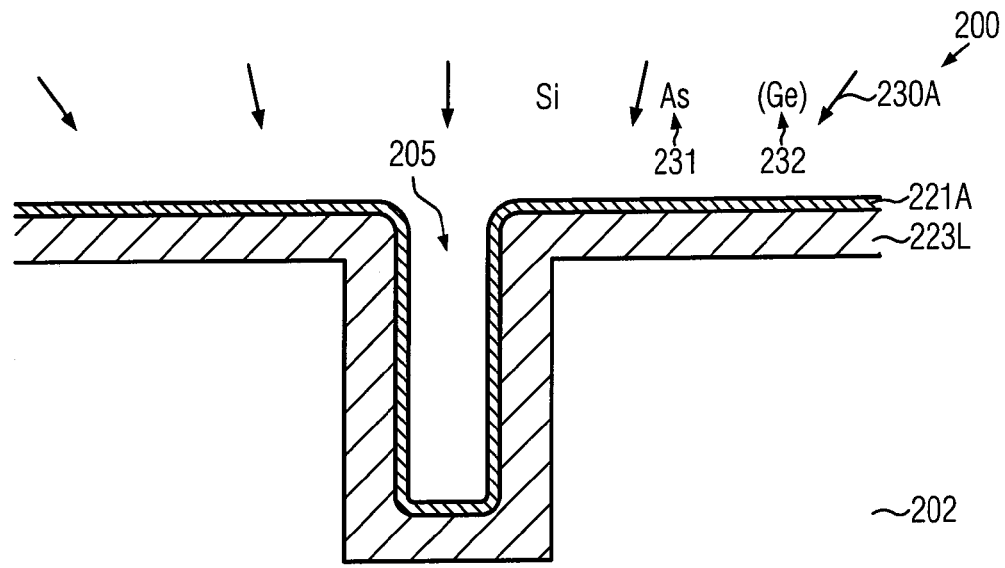

FIG. 2a schematically illustrates a cross-sectional view of an MIS structure in a manufacturing stage in which two stacked semiconductor electrode structures are to be incorporated into a semiconductor region.

Figure 2B:
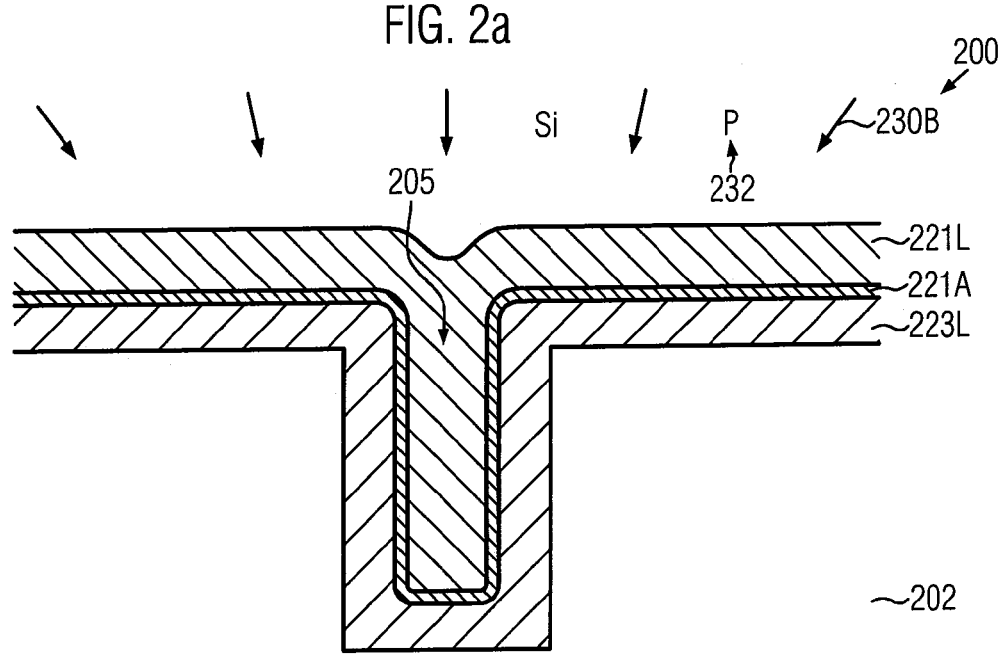

FIG. 2b schematically illustrates the device in a further advanced manufacturing stage in which the cavity is completely filled with a semiconductor material.

Figure 2C:
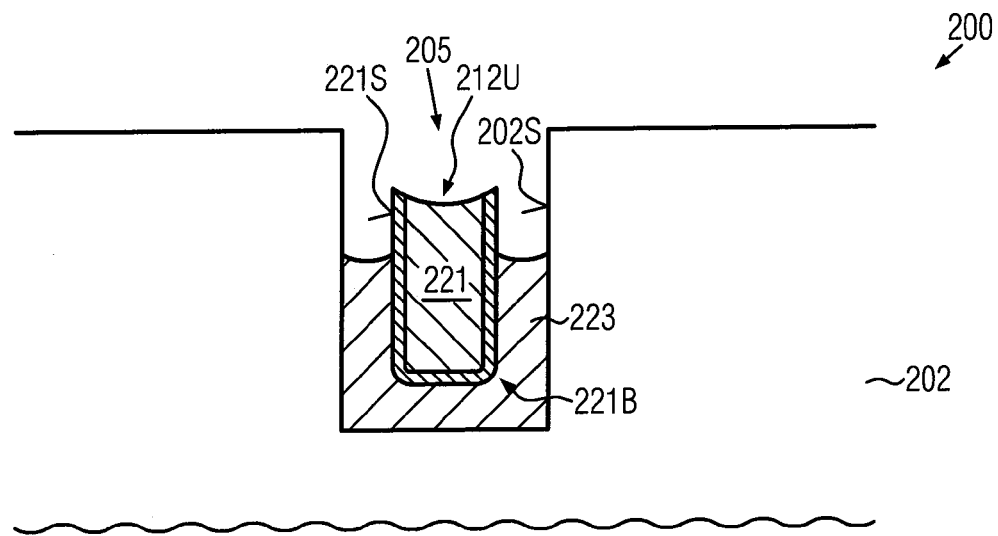

FIG. 2c schematically illustrates the device in a further advanced manufacturing stage.

Figure 2D:
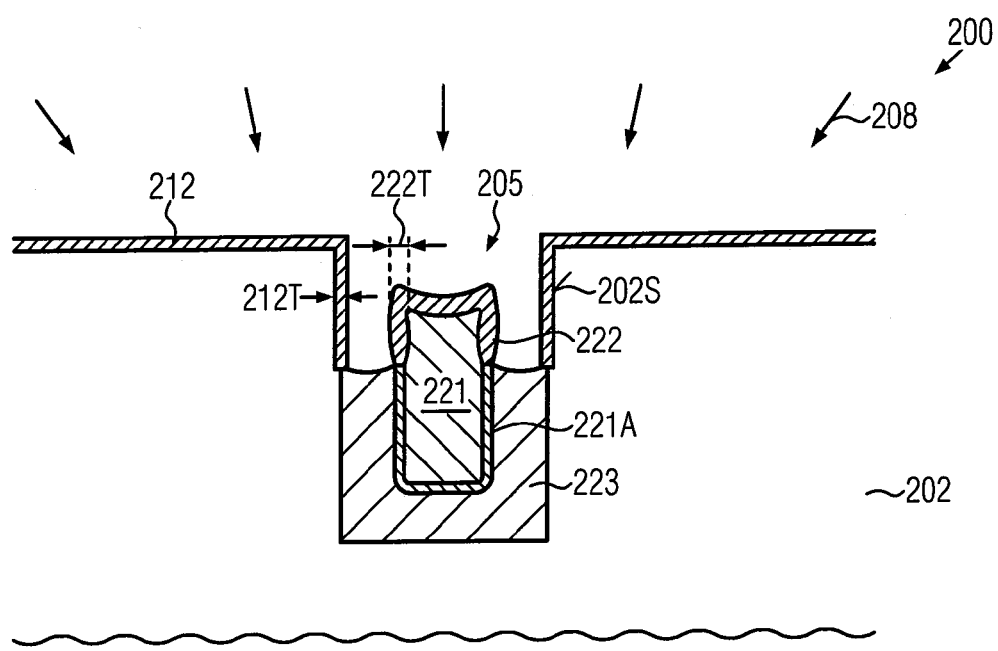

FIG. 2d schematically illustrates the device when exposed to a oxidizing ambient.

Figure 2E:
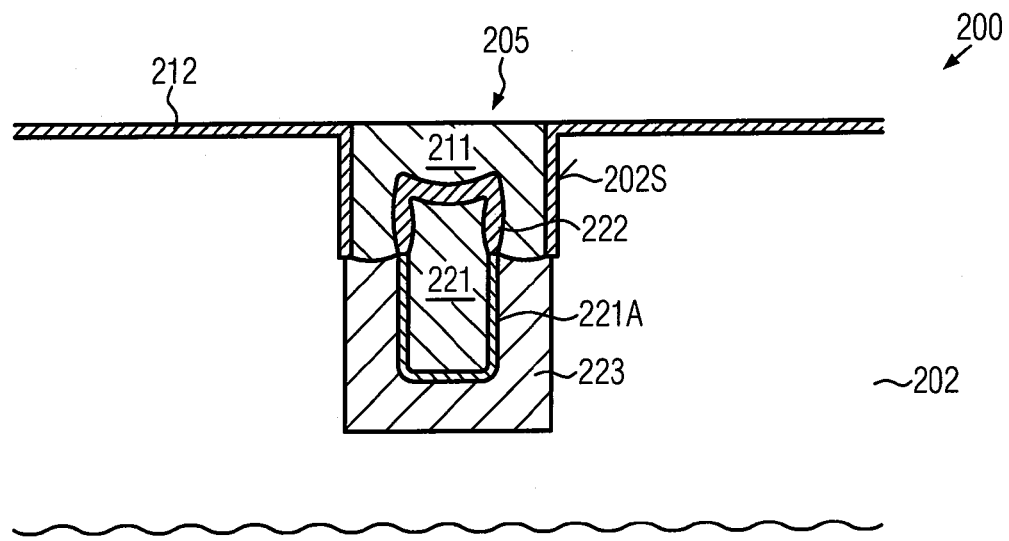

FIG. 2e schematically illustrates a cross-sectional view of the semiconductor device in a further advanced manufacturing stage.

Figure 2F:
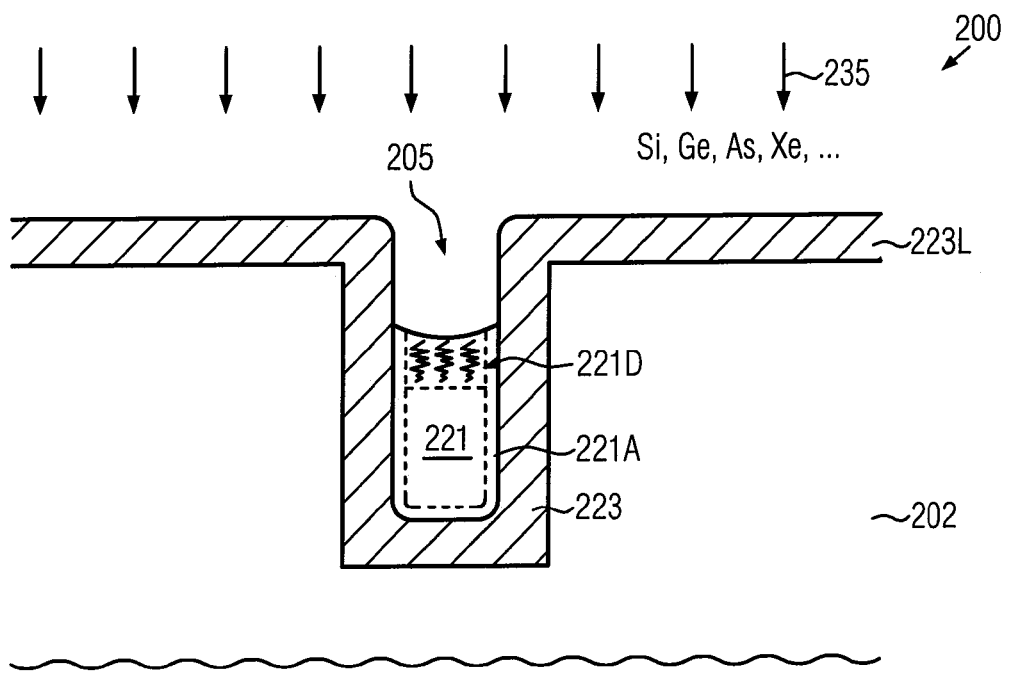

FIG. 2f schematically illustrates the semiconductor device according to further illustrative embodiments in which a further mechanism is implemented for locally increasing the oxidation rate of the semiconductor material.

Figure 2G:
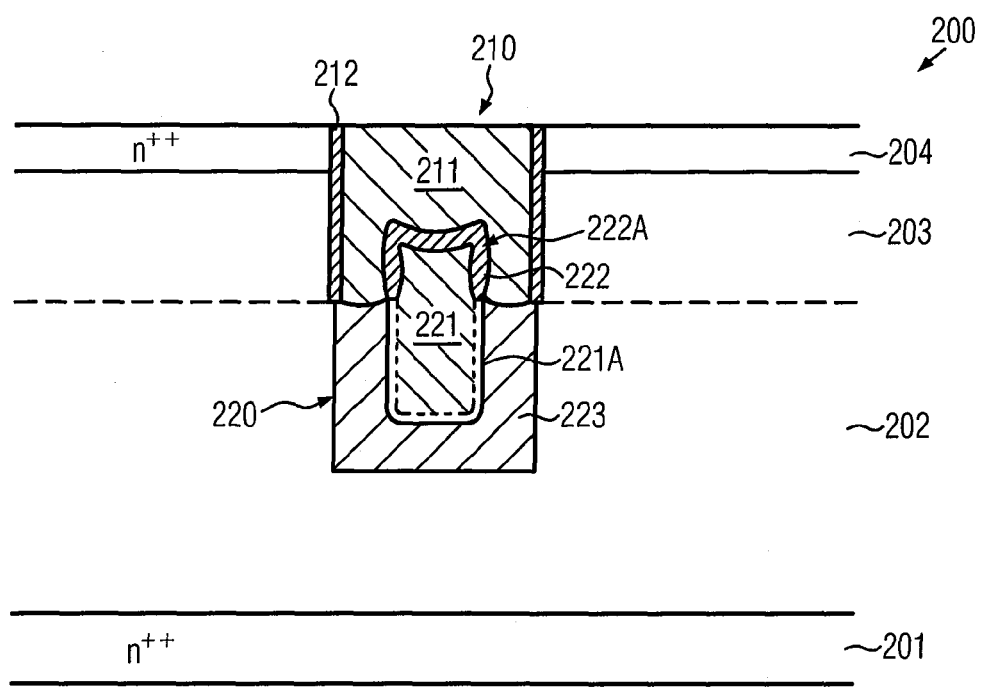

FIG. 2g schematically illustrates the device in a further advanced manufacturing stage.

DETAILED DESCRIPTION

In one aspect of the present disclosure, a method is provided that relates to forming an MIS structure wherein the method comprises forming a first semiconductor electrode in a cavity that is formed in a crystalline semiconductor region, wherein the first semiconductor electrode is electrically insulated from the crystalline semiconductor region by an insulating layer. The method further comprises increasing an oxidation rate of at least a portion of a surface of the first semiconductor electrode relative to an exposed surface of the crystalline semiconductor region in the cavity. Additionally, the method comprises concurrently oxidizing the exposed surface of the crystalline semiconductor region in the cavity and an exposed surface of the first semiconductor electrode so as to form a first oxide layer on the exposed surface of the crystalline semiconductor region and a second oxide layer on the exposed surface of the first semiconductor electrode. Finally, the method comprises forming a second semiconductor electrode in the cavity and above the first semiconductor electrode wherein the second semiconductor electrode is electrically isolated from the first semiconductor electrode by the second oxide layer.

Consequently, according to the method exposed surface areas in the cavity and exposed surface areas of the semiconductor electrode, which may represent a field plate electrode material, may have significantly different oxidation rate caused by the active increasing of the oxidation rate of the semiconductor electrode. To this end, a plurality of efficient mechanisms may be applied, such as increasing the diffusion rate by incorporating appropriate atomic species, damaging the polycrystalline structure of the material of the semiconductor electrode and the like. Consequently, the first and second oxide layers are formed with significantly different average thickness values, thereby enhancing the dielectric breakdown voltage between the first and second semiconductor electrodes and also providing for superior dynamic behavior, for instance when forming a transistor-like structure from the MIS structure.

In a further illustrative embodiment, the increasing of the oxidation rate comprises the incorporation of an arsenic dopant species. In this case it is taken advantage of the fact that highly doped semiconductor material, for instance in the form of a polysilicon material, may have a significantly increased oxidation rate compared to a lightly doped or non-doped polysilicon material, thereby providing an efficient mechanism for selectively increasing the resulting thickness of the first oxide layer. In particular, arsenic is known as a dopant species which may significantly increase the oxidation rate of polysilicon material.

In a further illustrative embodiment, the arsenic dopant species is at least partially incorporated upon depositing a semiconductor material of the first semiconductor electrode. In this manner, the arsenic dopant species may be incorporated into the first semiconductor electrode in a highly controlled manner without requiring additional process steps. To this end, at any appropriate phase of the corresponding deposition process, an appropriate precursor material such as arsenic hydride ($AsH_3$) may be supplied with a desired flow rate, thereby enabling the control of a concentration of the arsenic species within a certain sub-layer of the first semiconductor electrode.

In one illustrative embodiment, depositing the semiconductor material of the first semiconductor electrode comprises: forming a silicon-containing layer in the cavity and in-situ doping the silicon-containing layer with the arsenic dopant species. Thus, well-established semiconductor materials such as silicon may be used in combination with the arsenic dopant species, thereby providing for the desired high oxidation rate based on well-established silicon oxidation techniques, while additionally any arsenic species which may not be "consumed" during the oxidation process may be preserved in the first semiconductor electrode, thereby increasing the conductivity thereof.

In one illustrative embodiment the arsenic dopant species is at least partially incorporated into the first semiconductor electrode by performing an ion implantation process. In this manner the arsenic species may be incorporated at any appropriate manufacturing stage, for instance upon exposing a portion of the first semiconductor electrode in a highly controllable manner without unduly contributing to the overall process complexity. That is, ion implantation processes are well-established in the art and may be performed under very non-critical process conditions, such as room temperature, thereby contributing to a negligible increase of the overall process time, while nevertheless a very controllable operation of the arsenic dopant species may be accomplished. In some illustrative embodiments, the in-situ doping of at least a portion of the first semiconductor electrode may be combined with an ion implantation process, thereby even further enhancing the effect of increasing the overall oxidation rate.

In a further illustrative embodiment, the increasing of the oxidation rate comprises performing an ion implantation process using a non-doping implantation species so as to induce crystal damage in a part of the first semiconductor electrode. Consequently, by applying the implantation process the polycrystalline structure may efficiently be damaged or even completely destroyed using an implantation species which may not significantly affect the overall electronic characteristics of the semiconductor material. For example, silicon, germanium and the like may efficiently be used for creating heavy crystalline damage, wherein these species may be considered as non-doping species due to the same valence compared to the semiconductor material of the first electrode. In other cases, other inert dopant species such as xenon, argon and the like may efficiently be used in order to obtain desired high implantation damage at a moderately low implantation dose. For example, xenon may very efficiently be used for providing a substantially amorphous structure in the part of interest of the first semiconductor electrode, thereby also efficiently modifying the diffusion behavior of oxygen during the subsequent oxidation process. On the other hand, the moderately low implantation dose used may not negatively affect the overall conductivity of the first semiconductor electrode.

In a further illustrative embodiment of the present disclosure the oxidation rate may be increased by forming a semiconductor alloy at least in the portion of interest of the first semiconductor electrode. As is well known, a plurality of semiconductor alloys may have a significantly increased oxidation rate compared to substantially pure silicon material, such as polysilicon material, thereby providing an efficient mechanism for increasing the finally obtained thickness of the resulting oxide layer. For example, an appropriate species may be incorporated into the deposition atmosphere during the deposition of the semiconductor material of the first electrode, at least during an initial phase, if a continuous presence of the alloy-forming species is considered inappropriate for the first electrode. To this end, species such as germanium and the like may efficiently be used, wherein the concentration and local distribution of the germanium species may effectively be controlled during the deposition process.

According to a further aspect of the present disclosure, an MIS structure is provided which comprises a cavity formed in a crystalline semiconductor region and a first semiconductor electrode formed in the cavity so as to be electrically insulated from sidewalls of the cavity, wherein the first semiconductor electrode has an upper semiconductor portion. The MIS structure further comprises a second semiconductor electrode formed in a part of the cavity above the upper semiconductor portion of the first semiconductor electrode. Moreover, a first insulation layer is formed between the first and second semiconductor electrodes wherein the first insulation layer has a first average thickness and comprises an atomic species that imparts an increased oxidation rate to semiconductor material of the upper semiconductor portion. Additionally, the MIS structure comprises a second insulation layer formed between the second semiconductor electrode and the sidewalls of the cavity, wherein the second insulation layer has a second average thickness that is less than the first average thickness.

Consequently, as already explained above, the increased average thickness of the insulation layer between the first and second semiconductor electrodes provides for superior dielectric strength and also contributes to a gain in dynamic performance of the MIS structure. The first and second semiconductor electrodes comprise silicon in some illustrative embodiments wherein the atomic species is, in some illustrative embodiments, arsenic. In some illustrative embodiments, the atomic species is incorporated at least at and near a surface of a lower semiconductor portion of the first semiconductor electrode. Consequently, in this case the atomic species may not only enhance the oxidation rate of the upper portion of the first semiconductor electrode but may also contribute to superior conductivity of the entire first semiconductor electrode.

In some illustrative embodiments the first semiconductor electrode may additionally comprise a second dopant species, such as phosphorous, which may be provided in combination with arsenic, thereby even further enhancing the overall conductivity of the first semiconductor electrode. Providing phosphorous may enable the deposition of a polysilicon material that is highly in-situ doped with phosphorous without being restricted to a specific layer thickness. On the other hand, the arsenic dopant species may be provided in a surface layer in compliance with well-established in-situ doping deposition techniques, thereby providing the superior oxidation behavior of the first semiconductor electrode at least near the surface thereof.

In preferred embodiments, the MIS structure represents a vertical transistor configuration wherein the first semiconductor electrode acts as a field plate while the second semiconductor electrode represents the actual gate electrode of the transistor structure.

With reference to FIGS. 2a-2g and also referring to FIGS. 1a-1f, if appropriate, further illustrative embodiments of the present disclosure will now be described in more detail.

FIG. 2a schematically illustrates a cross-sectional view of an MIS structure 200 in a manufacturing stage in which two stacked semiconductor electrode structures are to be incorporated into a semiconductor region. The MIS structure 200 may represent a field effect transistor, as will be described in more detail with reference to FIG. 2g. In the manufacturing stage shown, the structure 200 comprises a semiconductor region 202, which may be a part of any appropriate semiconductor layer formed above a substrate, such as a silicon substrate or any other appropriate carrier material, which may be appropriate for forming vertical transistor structures. It should be appreciated that a corresponding substrate is not shown in FIG. 2a. Furthermore, the semiconductor region 202 may comprise any appropriate dopant concentration therein in order to define basic characteristics, such as the conductivity type and the like. Furthermore, the semiconductor region 202 may also comprise inversely doped areas, depending on the overall process strategy to be applied for completing the MIS structure 200. For example, in the manufacturing stage shown, the semiconductor region 202 may comprise highly doped regions, for instance to be used in the form of drain and source regions in combination with an appropriately doped channel region, while in other cases, as illustrated in FIG. 2a, any such stacked dopant configuration may be established in a later manufacturing stage. The semiconductor region 202 has formed therein a cavity 205 of any appropriate shape, for instance provided in the form of a trench or a plurality of trenches, which may be appropriately connected, depending on the overall characteristics of the structure 200. The cavity 205 has an appropriate cross-sectional shape so as to accommodate corresponding semiconductor electrode still to be formed, wherein also a depth of the cavity 205 is appropriately selected so as to extend into the semiconductor region 202 in order to provide for current flow controllability and a shielding effect, as for instance previously discussed with reference to a vertical MIS transistor, as shown in FIG. 1a. Furthermore, an insulation layer 223L, such as a silicon dioxide material and the like, is formed above the semiconductor region 202 and within the cavity 205, wherein the layer 223L has any appropriate material composition and thickness in order to ensure a desired electrical insulation of the field plate and may be provided in the cavity 205 with respect to the semiconductor region 202.

It should be appreciated that the cavity 205 and the insulation layer 223L may be formed using any appropriate process strategy, as is for instance also discussed above with reference to the semiconductor device 100. Moreover, in the embodiment shown, the device 200 is exposed to a deposition process 230A in which a semiconductor layer 221A is formed on the insulation layer 223L. For example, the material 221A may basically be comprised of silicon, which may be deposited in the form of a polycrystalline silicon material while also incorporating an appropriate species, such as a dopant species or an alloy-forming species, indicated by 231 and 232, respectively, thereby modifying the surface characteristics of a semiconductor electrode still to be formed with respect to its oxidation behavior. In one illustrative embodiment, the layer 221A may be formed using the dopant species 231, which in one advantageous embodiment is provided in the form of arsenic. In this case, an appropriate dopant concentration is incorporated during the deposition process 230A, which is also referred to herein as an in-situ process, thereby obtaining a desired high oxidation rate during the further processing of the device 200. It is well known that the incorporation of a high dopant concentration results in a significantly modified oxidation behavior compared to substantially non-doped or pure polysilicon material, wherein in particular arsenic has been proven to very efficiently increase the resulting oxidation rate. In the embodiment shown, the layer 221A is provided with a specified layer thickness, which is compatible with established deposition recipes for forming arsenic-doped polysilicon material, since frequently in single wafer deposition processes the thickness of the layer 221A comprising high arsenic concentration may not arbitrarily be increased which may, for instance, restrict the capability of completely filling the cavity 205 during the process 230A. In this case, a further semiconductor material, such as a polysilicon material, may be deposited in a later manufacturing stage, for instance by incorporating a different dopant species, such as phosphorous and the like, in order to obtain a desired high overall conductivity of the resulting semiconductor material.

In other illustrative embodiments, the layer 221A is provided as a semiconductor alloy, which is to be understood as a material mixture comprising at least silicon and a further species, such as germanium, which results in significantly different material characteristics compared to a substantially pure polysilicon material. The alloy-forming species 232 may be incorporated into the layer 221A by appropriately selecting the deposition conditions, for instance by providing an appropriate precursor gas to the deposition ambient at any appropriate phase of the deposition process 230A. For example, a silicon/germanium alloy may be deposited using well-established deposition recipes with a germanium concentration of up to 35 atomic percent or even higher, without any restriction with respect to the thickness of the layer 221A. If a significant modification of the oxidation rate caused by the alloy-forming species 232 is to be restricted to a specific surface layer, the process parameters may appropriately be adjusted such that the species 232 is incorporated during an initial phase only, while at any appropriate stage of the deposition process the supply of the precursor gas containing the species 232 may be discontinued. Thereafter, the process 230A may be continued in order to completely fill the cavity 205. In other cases, a reduced concentration of the species 232 may be incorporated during the further advance of the deposition process or a substantially constant concentration may be provided, if considered appropriate with respect to the overall device characteristics. For example, a silicon/germanium mixture may have a significantly higher conductivity compared to a polysilicon material and thus may be advantageous with respect to the dynamic behavior of the structure 200.

FIG. 2b schematically illustrates the device 200 in a further advanced manufacturing stage in which the cavity 205 is completely filled with a semiconductor material. In the embodiment shown, the device 200 comprises the previously formed layer 221A with any appropriate thickness and comprising material composition, for instance including a high arsenic dopant concentration, that modifies the oxidation rate, which may be approximately $10^{18}$ per cm$^3$ or higher, while a further semiconductor material layer 221L, such as a polysilicon layer, is provided so as to fill the cavity 205. To this end, a further deposition process 230B is applied which may be performed using appropriately selected process parameters, wherein also a further dopant species 232, for instance in the form of phosphorous, may be incorporated in order to appropriately adjust the overall conductivity of the semiconductor material in the cavity 205. As discussed above, in other cases, the layer 221L may have similar characteristics compared to the layer 221A, for instance with respect to the type of dopant species incorporated therein, alloy-forming species, dopant concentration and the like, if considered appropriately compatible with the device specifications or with depositing a semiconductor material in the cavity 205, as also discussed above with reference to FIG. 2a.

FIG. 2c schematically illustrates the device 200 in a further advanced manufacturing stage. As illustrated, any excess portions of the material layers 223L and 221A, 221L (cf. FIG. 2b) are removed, thereby providing an insulation layer 223 within the cavity 205, which electrically isolates a semiconductor material of a first electrode 221 from the crystalline semiconductor region 202. Moreover, an upper portion 221U of the electrode 221 may comprise exposed surface portions 221S within the cavity 205, while a lower portion 221B is covered by the dielectric material 223. Similarly, the cavity 205 may comprise exposed surface areas 202S of the crystalline material of the semiconductor region 202. The device configuration as shown in FIG. 2c can be obtained using any appropriate process strategy, as is also described above with reference to FIGS. 1e and 1f. That is, if desired, a planar surface topography can be obtained using any appropriate planarization process by removing portions of the layers 221A, 221L, while substantially preserving the layer 223L (cf. FIG. 2b). Thereafter, the semiconductor material may be etched in order to form the electrode 221, which may be accomplished using any appropriate etch recipe, followed by a removal of the dielectric layer 223L outside and partially within the cavity 205 in order to obtain the insulation layer 223. Consequently, upon exposing the upper portion 221U within the cavity 205, at least some of the surface areas 221S may have incorporated therein an appropriate atomic species, such as arsenic and the like, which may result in a significantly increased oxidation rate during the further processing of the device 200. It should be appreciated that, as discussed above, in other illustrative embodiments a corresponding oxidation rate increasing species may also continuously be provided throughout the entire upper portion 221U or even throughout the entire material 221.

FIG. 2d schematically illustrates the device 200 when exposed to a oxidizing ambient 208, in which concurrently any exposed surface areas of the semiconductor region 202 and in particular the sidewalls 202S within the cavity 205 and the surface portions 221S (cf. FIG. 2c) are oxidized in order to form a first oxide layer 222 on the exposed portions of the semiconductor material 221 and to form a second oxide layer 212, which may also be referred to as a gate dielectric layer. The process parameters of the oxidation process 208 are selected such that a desired average thickness 212T of the layer 212 formed on the substantially crystalline material of the semiconductor region 202 is obtained, thereby providing for superior material quality and thickness uniformity of the layer 212, which may act as a gate dielectric material, as discussed above. On the other hand, the same process parameters of the process 208 may result in a significantly increased oxidation efficiency and thus in an increased average layer thickness 222T of the oxide layer 222, thereby ensuring superior electrical insulation even at very critical areas, such as any corners and the like, which have been identified of major sources of reduced dielectric strength, as discussed above with reference to the semiconductor device 100. For example, the average thickness 222T may be greater by at least 25 percent or more compared to the average thickness 212T, thereby providing for the superior dielectric strength. The average thickness of a layer may be understood as the values of the layer thickness taken at a given number of representative positions divided by the number of sample values. Furthermore, the overall increased thickness 222T reduces the capacitive coupling between the electrode material 221 and a further electrode material still to be formed in the cavity 205, thereby also enhancing the dynamic behavior of the device

200. It should be appreciated that typically the layer 222, at least at sidewall areas of the material 221, may thus have incorporated therein an atomic species, such as arsenic, germanium and the like, which results in the increased oxidation rate during the oxidation process 208.

FIG. 2*e* schematically illustrates a cross-sectional view of the semiconductor device 200 in a further advanced manufacturing stage. As illustrated, a second semiconductor electrode material 211 is formed in the cavity 205 and thus is in contact with the first oxide layer 222 and the second oxide layer 212. The semiconductor material 211 may be provided in the form of any appropriate material such as a polysilicon material, a silicon/germanium material and the like. To this end, any appropriate deposition recipe may be applied, as is also described above with reference to the semiconductor device 100. After the deposition of the material 211 any excess portion thereof may be removed, for instance by CMP, etching and the like, as is also discussed above. Consequently, due to the increased thickness of the oxide layer 222 a reliable electrical isolation of the materials 221 and 211 is accomplished. On the other hand, the material 211 is appropriately separated from the crystalline semiconductor material of the region 202 by the layer 212, which may have a superior uniformity with respect to layer thickness and material composition due to the specifically-designed oxidation process 208 (cf. FIG. 2*d*).

FIG. 2*f* schematically illustrates the semiconductor device 200 according to further illustrative embodiments in which alternatively or additionally to the process sequence described above, a further mechanism is implemented for locally increasing the oxidation rate of the semiconductor material 221. In the manufacturing stage shown, the dielectric layer 223L is formed on the semiconductor region 202 and within the cavity 205, wherein the height of the semiconductor material 221 within the cavity 205 is appropriately adjusted by any appropriate etch technique, as is also described above. In some illustrative embodiments the semiconductor material 221 may comprise an oxidation rate modifying species, for instance in the form of a dopant species, such as arsenic, phosphorous and the like and/or in the form of an alloy-forming species, such as germanium and the like. For example, an arsenic-containing layer, such as the layer 221A previously described with reference to FIG. 2*a*, may be provided in the material 221, possibly in combination with a further core material comprising a high phosphorous concentration, as is also discussed above. In other cases a moderately doped polysilicon material of substantially homogeneous composition may be provided in this manufacturing stage. Furthermore, the device 200 may be exposed to an ion implantation process 235 in order to incorporate a specific implantation species, which may result in heavy crystal damage, thereby significantly modifying the polycrystalline structure of the material 221 within a damaged portion 221D. In some illustrative embodiments, the implantation species 235 may be selected as a substantially non-doping species, such as silicon, germanium and the like, which is intended to destroy or heavily damage the polycrystalline structure, however without significantly modifying the basic dopant concentration. Consequently, during the process 235 the portion 221D is provided as a substantially amorphized material portion, which may also have a significantly modified oxidation rate during the further processing. For example, xenon is a very heavy atomic species and thus creates significant damage, even if provided at a moderately low implantation dose so that the presence of the additional xenon species in the portion 221D may not significantly affect the overall electronic characteristics.

In other illustrative embodiments, the implantation process 235 may be applied using a desired dopant species, such as arsenic, thereby incorporating the dopant species in the portion 221D in a locally restricted manner without being restricted by any deposition-related constraints when providing arsenic during an in-situ doping process. Thus, the portion 221D may appropriately be "enriched" with the arsenic species while at the same time creating significant crystal damage. It should be appreciated that appropriate process parameters for the implantation process 235 may readily be established using experiments and/or simulation calculations since ion implantation is a well-established process technique in the field of semiconductor fabrication.

After the implantation process 235 the further processing is continued by removing excess portions of the layer 223L, as is also previously discussed, and subsequently oxidizing the resulting structure using an oxidation process, such as the process 208, as previously described with reference to FIG. 2*d*.

FIG. 2*g* schematically illustrates the device 200 in a further advanced manufacturing stage. As illustrated, the device 200 comprises a semiconductor region 201, which may represent a drain region of the structure 200, followed by the semiconductor region 202, which in this manufacturing stage represents a drift region, followed by a channel region 203 and a heavily doped source region 204. Consequently, the stacked semiconductor regions 201, 202, 203, 204 may provide the basic configuration of a vertical transistor architecture, as is also previously discussed with reference to the semiconductor device 100. Furthermore, a gate electrode structure 210, which comprises the semiconductor material 211 and the gate dielectric layer 212, is provided in combination with a field plate electrode structure 220, which comprises the semiconductor material 221, the insulation layer 223 and the oxide layer 222. The device 200 as illustrated in FIG. 2*g* may be formed using any appropriate process strategy, for instance by incorporating an appropriate dopant concentration and profile in the various semiconductor regions 201, . . . , 204 which may be accomplished by ion implantation, epitaxial growth techniques and the like, while the electrode structures 210, 220 may be formed using a process sequence as described above. It should be appreciated that any contact structures for connecting to the field plate electrode structure 220 and to the gate electrode structure 210 are not shown in FIG. 2*g*. Similarly, any contacts for connecting to the drain and source regions 201, 204 are not illustrated in order to not unduly obscure the basic principles of the present disclosure.

Thus, the electrode materials 211 and 221 are appropriately isolated from each other by means of the oxide layer 221 having the increased average thickness, as discussed above, wherein the layer 222 may comprise, at least locally, specific concentration of an oxidation rate increasing species, as indicated by 222*a*, for instance in the form of an alloy-forming species, a dopant species such as arsenic and the like as previously discussed. Furthermore, the semiconductor material 221 may also comprise in its lower portion an oxidation rate increasing species, for instance as indicated by the layer 221A, which may comprise an arsenic species and the like, as is also previously discussed. On the other hand, the gate dielectric layer 212 may provide for superior uniformity of the overall transistor characteristics, as is also discussed above.

As a consequence, the present disclosure provides semiconductor devices and manufacturing techniques in which the dynamic behavior and the electrical isolation of a buried electrode system comprising a gate electrode structure and a field plate electric structure may significantly be improved while nevertheless the corresponding oxide layer may be formed in a common oxidation process. To this end, the oxidation rate of the field plate electrode material is appropriately increased, for instance in some illustrative embodiments by incorporating an arsenic dopant species.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming an MIS (metal-insulator-semiconductor) structure, the method comprising:
   forming a first semiconductor electrode in a cavity formed in a crystalline semiconductor region, said first semiconductor electrode being electrically insulated from said crystalline semiconductor region by an insulating layer, wherein forming the first semiconductor electrode includes forming a first semiconductor layer that includes a first added species and forming a second semiconductor layer that includes a second added species, the first semiconductor layer being positioned between the second semiconductor layer and the insulating layer, wherein the second added species is configured to increase an oxidation rate of at least a portion of a surface of said first semiconductor electrode relatively to an exposed surface of said crystalline semiconductor region in said cavity,
   forming a first oxide layer on said exposed surface of said first semiconductor electrode and a second oxide layer on said exposed surface of said crystalline semiconductor region by concurrently oxidizing said exposed surface of said crystalline semiconductor region in said cavity and the exposed surface of said first semiconductor electrode, and
   forming a second semiconductor electrode in said cavity and above said first semiconductor electrode, said second semiconductor electrode being electrically insulated from said first semiconductor electrode by said first oxide layer.

2. The method of claim 1, wherein the second added species includes an arsenic dopant species.

3. The method of claim 2, wherein said arsenic dopant species is at least partially incorporated while depositing the semiconductor layer.

4. The method of claim 1, wherein forming the first semiconductor layer comprises forming a first silicon containing layer in said cavity and in-situ doping said first silicon containing layer with said first added species.

5. The method of claim 4, wherein forming the second semiconductor layer comprises depositing a second silicon containing layer above said first silicon containing layer and adding the second added species to said second silicon containing layer.

6. The method of claim 1, wherein said second added species is at least partially incorporated by performing an ion implantation process.

7. The method of claim 1, wherein forming said second semiconductor layer comprises inducing crystal damage in a part of said second semiconductor layer by performing an ion implantation process using a non-doping implantation species as the second added species.

8. The method of claim 7, wherein said non-doping implantation species comprises one of silicon, germanium, xenon and argon.

9. The method of claim 1, wherein forming said first semiconductor layer comprises forming a semiconductor alloy.

10. The method of claim 9, wherein said semiconductor alloy comprises germanium.

11. An MIS (metal-insulator-semiconductor) structure comprising:
    a crystalline semiconductor region having a cavity,
    a first insulation layer in the cavity,
    a first semiconductor electrode formed in said cavity and electrically insulated from sidewalls of said cavity by the first insulation layer, said first semiconductor electrode including:
       a first semiconductor layer that includes a first oxidation rate increasing species configured to increase an oxidation rate of the first semiconductor layer, and
       a second semiconductor layer, the first semiconductor layer being positioned between the second semiconductor layer and the insulating layer,
    a second semiconductor electrode formed in a part of said cavity above said first semiconductor electrode,
    a second insulation layer formed between said first and second semiconductor electrodes, said second insulation layer having a first average thickness and comprising a second oxidation rate increasing species, and
    a third insulation layer formed between said second semiconductor electrode and said sidewalls of said cavity, said third insulation layer having a second average thickness that is less than said first average thickness.

12. The MIS structure of claim 11, wherein said first and second semiconductor electrodes comprise silicon and wherein said first oxidation rate increasing species is arsenic.

13. The MIS structure of claim 11, wherein said second oxidation rate increasing species is also incorporated in an upper portion of said second semiconductor layer.

14. The MIS structure of claim 13, wherein the first oxidation rate increasing species is a dopant species and the second oxidation rate increasing species is a non-dopant species.

15. The MIS structure of claim 11, wherein said MIS structure is a vertical transistor structure with said second semiconductor electrode being a gate electrode of the vertical transistor structure.

16. A method of forming an MIS (metal-insulator-semiconductor) structure, the method comprising:
    forming a first semiconductor electrode in a cavity formed in a crystalline semiconductor region, said first semiconductor electrode being electrically insulated from said crystalline semiconductor region by an insulating layer;
    forming a first oxide layer on an exposed surface of said first semiconductor electrode in said cavity and a second oxide layer on an exposed surface of said crystalline semiconductor region by concurrently oxidizing the exposed surface of said crystalline semiconductor region and the exposed surface of said first semiconductor electrode; and
    forming a second semiconductor electrode in said cavity and above said first semiconductor electrode, said second semiconductor electrode being electrically insulated from said first semiconductor electrode by said first oxide layer, wherein forming said first semiconductor electrode comprises depositing a first silicon containing layer with an increased oxidation rate relative to the exposed surface of said crystalline semiconductor region in said cavity and depositing a second silicon containing layer above said first silicon containing layer with a different oxidation rate relative to said first silicon containing layer.

17. The method of claim 16, wherein forming the first silicon containing layer includes incorporating an arsenic dopant species in the first silicon containing layer.

18. The method of claim 16, wherein forming the first silicon containing layer relative to the exposed surface of said crystalline semiconductor region in said cavity comprises forming the first silicon containing layer as a semiconductor alloy.

19. The method of claim 18, wherein said semiconductor alloy comprises germanium.

20. The method of claim 16, wherein forming said first semiconductor electrode includes increasing the oxidation rate of the exposed surface the first semiconductor electrode relative to the exposed surface of said crystalline semiconductor region in said cavity by performing an ion implantation process.

21. The method of claim 20, wherein performing the ion implantation process includes using a non-doping implantation species to induce crystal damage in the exposed surface of said first semiconductor electrode.

22. The method of claim 21, wherein said non-doping implantation species comprises one of silicon, germanium, xenon and argon.

23. An MIS (metal-insulator-semiconductor) structure comprising:
a crystalline semiconductor region having a cavity;
a first semiconductor electrode formed in said cavity and electrically insulated from sidewalls of said cavity, said first semiconductor electrode having an upper semiconductor portion;
a second semiconductor electrode positioned in a part of said cavity above said upper semiconductor portion of said first semiconductor electrode;
a first insulation layer positioned between said first and second semiconductor electrodes, said first insulation layer having a first average thickness; and
a second insulation layer positioned between said second semiconductor electrode and said sidewalls of said cavity, said second insulation layer having a second average thickness that is less than said first average thickness, wherein:
said first semiconductor electrode comprises an atomic species that imparts an increased oxidation rate relative to an exposed surface of said crystalline semiconductor region in said cavity; and
said atomic species is locally restricted to a surface layer in said first semiconductor electrode.

24. The MIS structure of claim 23, wherein said first semiconductor electrode comprise silicon and wherein said atomic species is arsenic.

25. The MIS structure of claim 23, wherein said first semiconductor electrode comprise silicon and wherein said atomic species is non-doping implantation species.

26. The MIS structure of claim 25, wherein said non-doping implantation species comprises one of germanium, xenon and argon.

27. The MIS structure of claim 23, wherein said MIS structure is a vertical transistor structure with said second semiconductor electrode being a gate electrode.

* * * * *

UNITED STATES PATENT AND TRADEMARK OFFICE
CERTIFICATE OF CORRECTION

PATENT NO.       : 8,476,136 B2                                    Page 1 of 1
APPLICATION NO.  : 13/324896
DATED            : July 2, 2013
INVENTOR(S)      : Anna Borzi et al.

It is certified that error appears in the above-identified patent and that said Letters Patent is hereby corrected as shown below:

Title Page,

Item (30):
--December 14, 2010 (IT)......VI2010A000336-- was omitted from the face of the patent.

Signed and Sealed this
Fourth Day of February, 2014

Michelle K. Lee
*Deputy Director of the United States Patent and Trademark Office*